US012666555B2

(12) United States Patent
Cheng et al.

(10) Patent No.:  US 12,666,555 B2
(45) Date of Patent:      Jun. 23, 2026

(54) DISPLAY DEVICE AND MANUFACTURING METHOD OF THE SAME

(71) Applicant: E Ink Holdings Inc., Hsinchu (TW)

(72) Inventors: Wei-Sung Cheng, Hsinchu (TW);
Ming-Huan Yang, Hsinchu (TW)

(73) Assignee: E Ink Holdings Inc., Hsinchu (TW)

( * ) Notice: Subject to any disclaimer, the term of this
patent is extended or adjusted under 35
U.S.C. 154(b) by 512 days.

(21) Appl. No.: 18/169,189

(22) Filed: Feb. 14, 2023

(65) Prior Publication Data

US 2023/0320012 A1      Oct. 5, 2023

(30) Foreign Application Priority Data

Apr. 1, 2022      (TW) ................................. 111112727

(51) Int. Cl.
*H05K 5/06*            (2006.01)
*B32B 7/02*            (2019.01)
(Continued)

(52) U.S. Cl.
CPC ............... *H05K 5/062* (2013.01); *B32B 7/02*
(2013.01); *B32B 7/12* (2013.01); *B32B 37/24*
(2013.01);
(Continued)

(58) Field of Classification Search
CPC ........ H05K 5/062; H05K 5/0018; B32B 7/02;
B32B 7/12; B32B 37/24; B32B 2037/243;
(Continued)

(56) References Cited

U.S. PATENT DOCUMENTS

| | | | |
|---|---|---|---|
| 2009/0290117 A1 | 11/2009 | Watanabe et al. | |
| 2014/0168152 A1 | 6/2014 | Ishizaki et al. | |
| 2020/0287159 A1* | 9/2020 | Lee ................... | H10K 59/8722 |

FOREIGN PATENT DOCUMENTS

| | | |
|---|---|---|
| CN | 103885235 A | 6/2014 |
| CN | 103970336 A | 8/2014 |

(Continued)

OTHER PUBLICATIONS

Sui, Shuo et al. "A capillary-based microfluidic device enables
primary high-throughput room-temperature crystallographic screen-
ing." J. Appl. Cryst. (2021). vol. 54, Pt 4, 1034-1046, Jun. 14, 2021.
(Continued)

*Primary Examiner* — Frank J Vineis
*Assistant Examiner* — Laura B Figg
(74) *Attorney, Agent, or Firm* — CKC & Partners Co.,
LLC

(57)                   ABSTRACT
A display device includes a display area and a periphery
area. The display device includes a display panel and a touch
module located on the display panel. The display panel
includes a driving substrate, a display medium layer located
on the driving substrate, a top electrode located on the
display medium layer, and a sealant surrounding the display
medium layer and the top electrode. The sealant includes a
first section and at least one second section connected with
the first section. The first section is located between the top
electrode and the driving substrate. A thickness of the second
section is greater than a thickness of the first section. The
touch module includes a bonding region located in the
periphery region. An orthogonal projection of the bonding
region on the driving substrate overlaps an orthogonal
projection of the first section on the driving substrate.

11 Claims, 9 Drawing Sheets

(51) Int. Cl.

| | | |
|---|---|---|
| *B32B 7/12* | (2006.01) | |
| *B32B 37/24* | (2006.01) | |
| *G06F 3/041* | (2006.01) | |
| *H05K 5/00* | (2025.01) | |

(52) U.S. Cl.

CPC ...... *H05K 5/0018* (2022.08); *B32B 2037/243* (2013.01); *B32B 2457/208* (2013.01); *G06F 3/0412* (2013.01); *G06F 2203/04103* (2013.01)

(58) Field of Classification Search

CPC ............. B32B 2457/208; G06F 3/0412; G06F 2203/04103

See application file for complete search history.

(56)         References Cited

FOREIGN PATENT DOCUMENTS

| | | |
|---|---|---|
| CN | 106707631 A | 5/2017 |
| CN | 112602145 A | 4/2021 |
| TW | 201537404 A | 10/2015 |

OTHER PUBLICATIONS

The office action of corresponding TW applicaion No. 11112727 issued on Mar. 16, 2023.
The office action of corresponding CN application No. 202210347274.2 issued on Apr. 28, 2026.

* cited by examiner

DISPLAY DEVICE AND MANUFACTURING METHOD OF THE SAME

CROSS-REFERENCE TO RELATED APPLICATION

This application claims priority to Taiwan Application Serial Number 111112727, filed Apr. 1, 2022, which is herein incorporated by reference in its entirety.

BACKGROUND

Field of Invention

The present invention relates to a display device and a manufacturing method of the display device.

Description of Related Art

A sealant is used in a display device to prevent vapor from permeating into the display medium layer nowadays. However, the thickness of the sealant may be higher than a top surface of the display panel, and therefore a bonding region or a fan-out region is squeezed when a touch panel is attached thereon. Therefore, failure of the display panel and the touch module may easily occur in a thermal shock test.

Accordingly, it is still a development direction for the industry to provide a display device that can solve the problems mentioned above.

SUMMARY

The invention provides a display device.

In some embodiments, the display device includes a display area and a periphery area. The display device includes a display panel and a touch module located on the display panel. The display panel includes a driving substrate, a display medium layer located on the driving substrate, a top electrode located on the display medium layer, and a sealant surrounding the display medium layer and the top electrode. The sealant includes a first section and at least one second section connected with the first section. The first section is located between the top electrode and the driving substrate. A thickness of the second section is greater than a thickness of the first section. The touch module includes a bonding region located in the periphery region. An orthogonal projection of the bonding region on the driving substrate overlaps an orthogonal projection of the first section on the driving substrate.

In some embodiments, the orthogonal projection of the bonding region on the driving substrate is away from an orthogonal projection of the second section on the driving substrate.

In some embodiments, the thickness of the first section equals a distance between a bottom surface of the top electrode facing the driving substrate and a top surface of the driving substrate facing the top electrode.

In some embodiments, the orthogonal projection of the first section on the driving substrate is located within an orthogonal projection of the top electrode on the driving substrate.

In some embodiments, the thickness of the second section is greater than a sum of a thickness of the display medium layer and a thickness of the top electrode.

In some embodiments, the orthogonal projection of the second section on the driving substrate is located partially outside the orthogonal projection of the top electrode on the driving substrate.

In some embodiments, a number of the second section is plural, and the second sections are located at two sides of the first section.

In some embodiments, the display device further includes a bending region, the sealant further includes a third section located in the bending region, and the third section is located between the top electrode and the driving substrate.

In some embodiments, an orthogonal projection of the third section on the driving substrate is located within the orthogonal projection of the top electrode on the driving substrate.

In some embodiments, the sealant further includes a fourth section away from the bending region, and a thickness of the fourth section is greater than a thickness of the third section.

In some embodiments, an orthogonal projection of the fourth section on the driving substrate is located partially outside the orthogonal projection of the top electrode on the driving substrate.

Another aspect of the present disclosure is a manufacturing method of a display device.

In some embodiments, the manufacturing method includes disposing an top electrode of a display panel on a display medium layer of a driving substrate, the top electrode, the driving substrate, and the display medium layer collectively form a channel, and the channel comprises a first region and at least one second region; coating a sealant of the display panel in the second region of the channel such that the sealant flows towards the first region from the second region; and disposing a touch module above the display panel, the touch module comprises a bonding region, the bonding region is located in a non-display region of the display panel, and an orthogonal projection of the bonding region on the driving substrate overlaps an orthogonal projection of the first region on the driving substrate.

In some embodiments, the manufacturing method further includes disposing the touch module above the display panel such that the bonding region is away from the second region.

In some embodiments, a number of the second region is plural, and the second regions are located at two sides of the first region.

In some embodiments, in the step of coating the sealant, a temperature of the sealant is heated to greater than 50 degree Celsius, and a pressure of spray coating is greater than 15 kpa.

In some embodiments, an orthogonal projection of the first region on the driving substrate is located within an orthogonal projection of the top electrode on the driving substrate.

In some embodiments, after the sealant flows towards the first region from the second region, the sealant in the second region forms a second section, and a thickness of the second section is greater than a sum of a thickness of the display medium layer and a thickness of the top electrode.

In some embodiments, an orthogonal projection of the top electrode on the driving substrate partially overlaps an orthogonal projection of the second section on the driving substrate.

In some embodiments, the display device further includes a bending region, the channel further includes a third region located in the bending region and a fourth region away from the bending region, and the manufacturing method further includes coating the sealant in the fourth region of the channel such that the sealant flows towards the third region from the fourth region.

In some embodiments, a viscosity of the sealant is smaller than 1200 centipoise.

In the aforementioned embodiments, the sealant in the second section away from the bending region flows towards the first region overlapping the bending region by capillarity action. In other words, the portions of the sealant in different regions have different thickness, and the first section of the sealant overlapping the bonding region is merely located in the first region. As such, the sealant below the bonding region is prevented from protruding and squeezing the bonding region. Therefore, failure of the circuit of the bonding region can be avoided.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
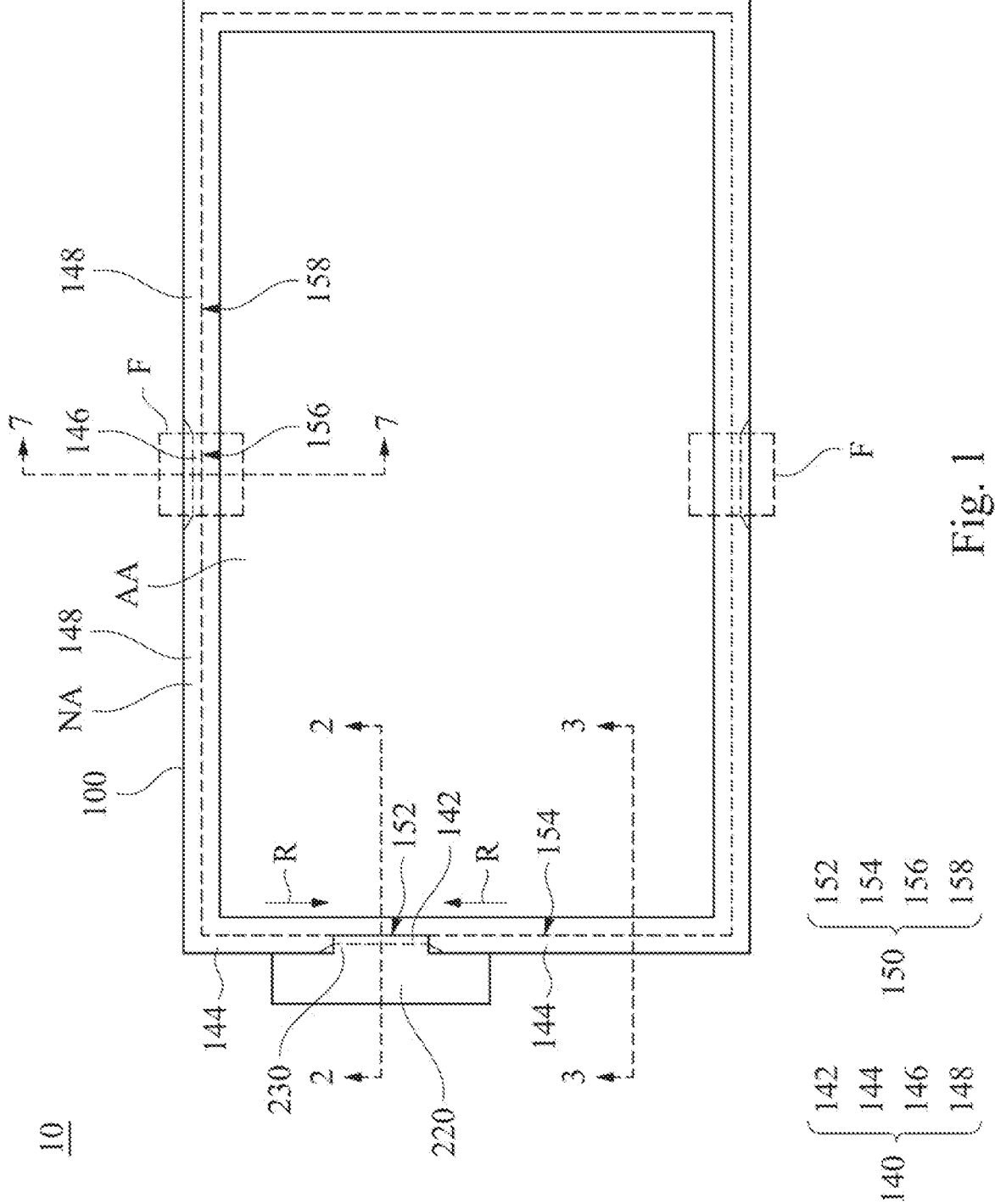
FIG. 1 is a top view of a display device according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

Figure 2:
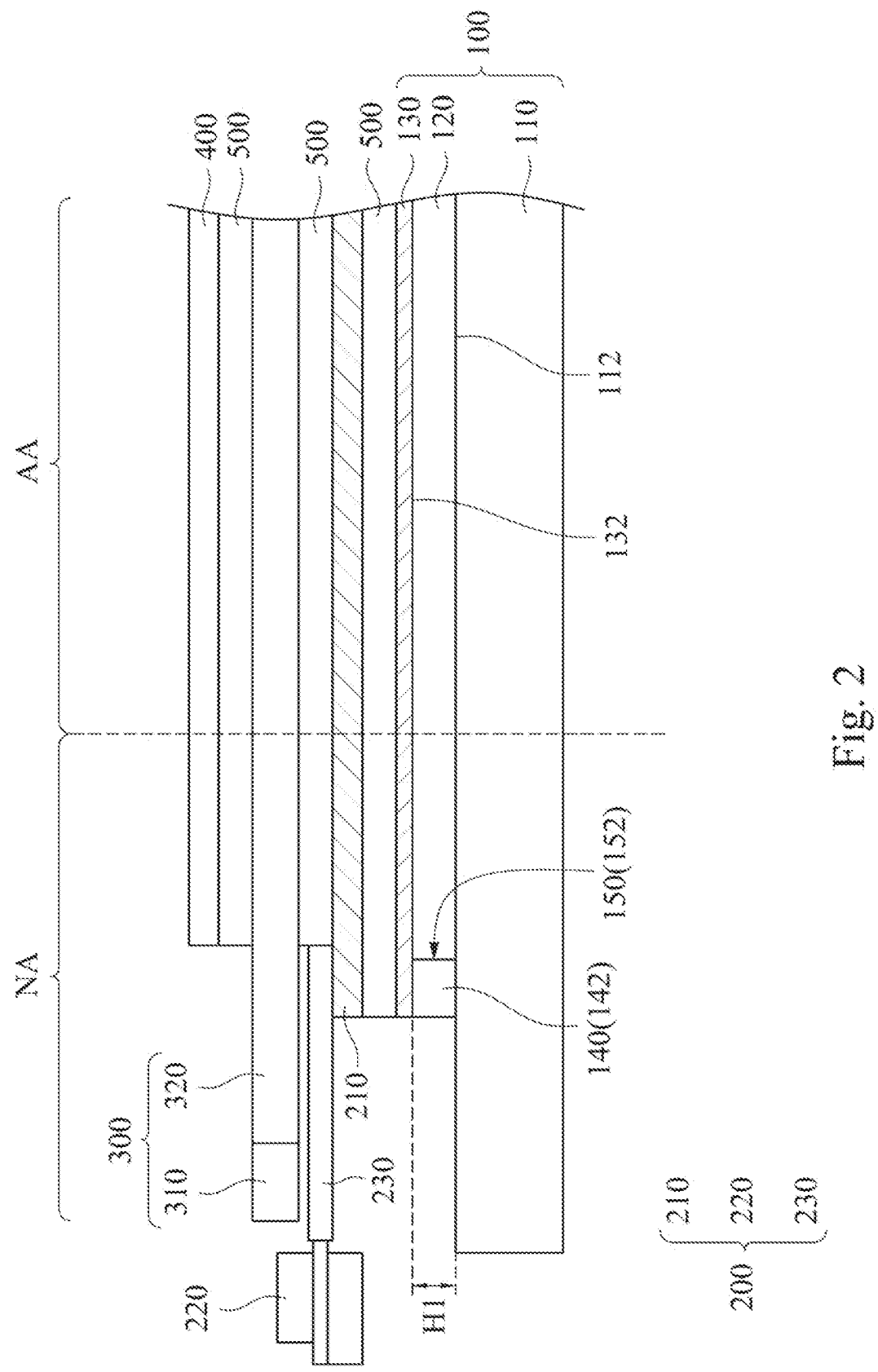
FIG. 2 is a cross-sectional view taken along the line 2-2 in FIG. 1.

FIG. 1 is a top view of a display device 10 according to one embodiment of the present disclosure. FIG. 2 is a cross-sectional view taken along the line 2-2 in FIG. 1. Reference is made to FIG. 1 and FIG. 2. The display device 10 includes a display region AA and a non-display region NA. Reference is made to FIG. 2. The display device 10 includes a display panel 100 and a touch module 200. The display panel 100 includes a driving substrate 110, a display medium layer 120, a top electrode 130 and a sealant 140. The display medium layer 120 is located on the driving substrate 110. The top electrode 130 is located on the display medium layer 120. The sealant 140 is located on the driving substrate 110 and surrounds the display medium layer 120 and the top electrode 130.

Reference is made to FIG. 2. The touch module 200 is disposed on the display panel 100. The touch module 200 includes a touch layer 210, a circuit board 220, and a bonding region 230. The bonding region 230 is located in the non-display region NA of the display device 10 and extends outward from the non-display region NA. The bonding region 230 includes metal circuits such as electrical connection pad and fan-out region.

The display device 10 further includes a light guide module 300 and a cover plate 400. The light guide module 300 includes a light source 310 and a light guide plate 320. The light guide plate 320 is located between the touch layer 210 and the cover plate 400, and the light guide plate 320 is adhered to the touch layer 210 and the cover plate 400 through optical adhesive layers 500. The touch layer 210 and the top electrode 130 are adhered together though one of the optical adhesive layer 500. The cover plate 400 is adhered to the light guide plate 320 though another one of the optical adhesive layer 500.

As shown in FIG. 2, the sealant 140 includes a first section 142 that overlaps the bonding region 230 along a vertical direction. The driving substrate 110, the top electrode 130, and the display medium layer 120 collectively form a channel 150 which is a semi-opened channel. A portion of the channel 150 overlapping the bonding region 230 along the vertical direction is the first region 152. The first section 142 is located in the first region 152. The first section 142 of the sealant 140 is formed by filling the first region 152 by capillarity action, and therefore, the first section 142 is merely located between the top electrode 130 and the driving substrate 110. Specifically, the driving substrate 110 includes a bottom electrode (not shown). Therefore, the first section 142 can be considered as located merely between the bottom electrode and the top electrode 130. The thickness H1 of the first section 142 equals the distance between the bottom surface 132 of the top electrode 130 facing the driving substrate 110 and the top surface 112 of the driving substrate facing the top electrode 130. In other words, an orthogonal projection of the bonding region 230 on the driving substrate 110 overlaps an orthogonal projection of the first section 142 on the driving substrate 110. The orthogonal projection of the first section 142 on the driving substrate 110 is located within an orthogonal projection of the top electrode 130 on the driving substrate 110.

Figure 3:
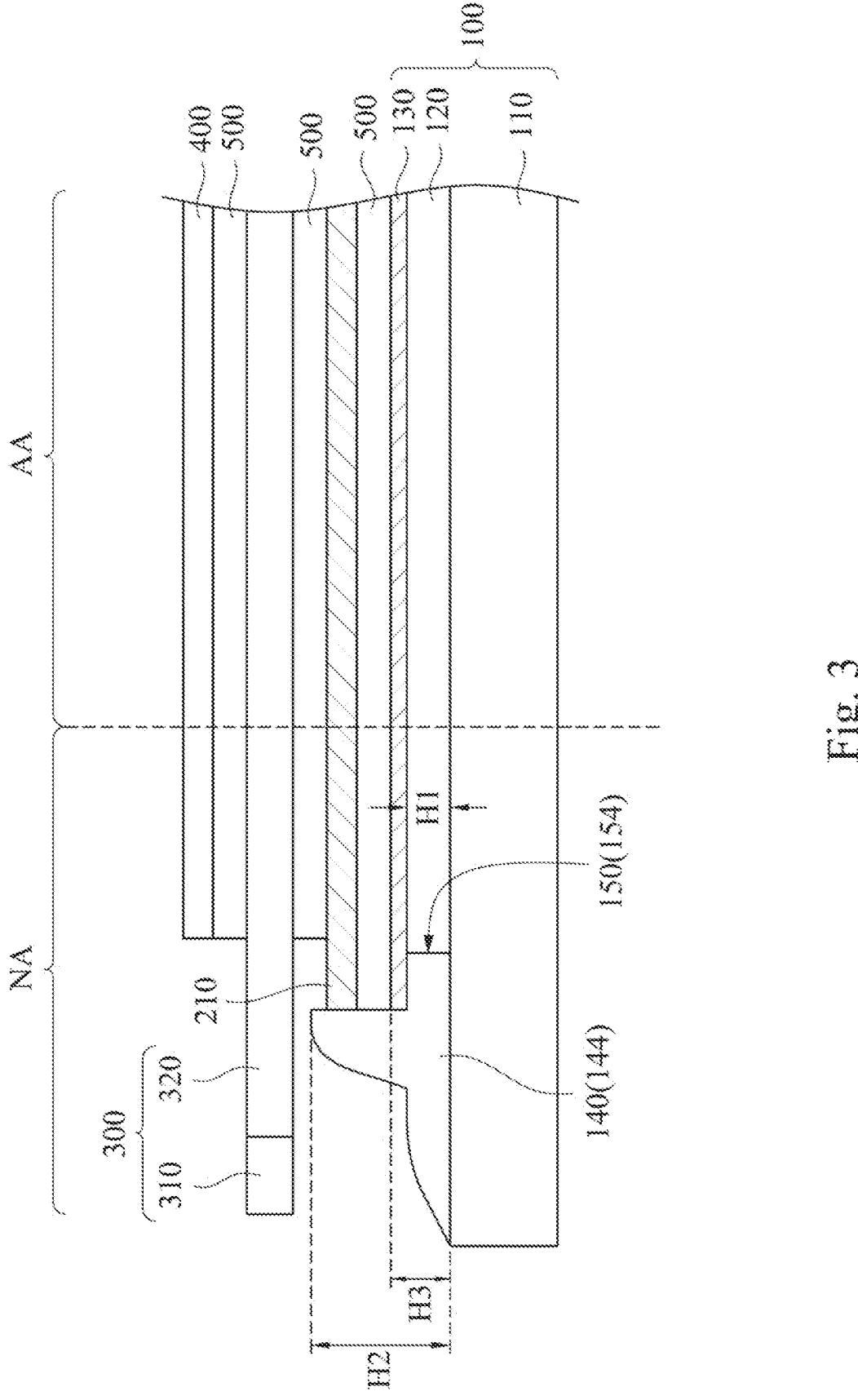
FIG. 3 is a cross-sectional view taken along the line 3-3 in FIG. 1.

FIG. 3 is a cross-sectional view taken along the line 3-3 in FIG. 1. Reference is made to FIG. 1 and FIG. 3. The sealant 140 further includes a second section 144 connected with the first section 142. The second section 144 does not overlap the bonding region 230 along the vertical direction. In other words, the orthogonal projection of the bonding region 230 on the driving substrate 110 is away from the orthogonal projection of the second section 144 on the driving substrate 110. The second region 154 is a portion of the channel 150 that does not overlap the bonding region 230. The second section 144 is located in the second region 154. The second section 144 is located on the driving substrate 110 and surrounds the top electrode 130 and the display medium layer 120. Therefore, the orthogonal projection of the second section 144 on the driving substrate 110 is partially located outside the orthogonal projection of top electrode 130 on the driving substrate 110. The thickness H2 of the second section 144 is greater than the thickness H1. In the present embodiment, the thickness H2 of the second section 144 is greater than the thickness H3, and the thickness H3 equals a sum of the thickness H1 of the display medium layer 120 and the thickness of the top electrode, but the present disclosure is not limited thereto. In the present embodiment, the thickness of the top electrode 130 is about 10 micrometers, and the thickness of the display medium layer 120 is about 55 micrometers.

Reference is made to FIG. 1. In the present embodiment, the display device 10 includes a first region 152 and two second regions 154. The second regions 154 are located at two sides of the first region 152. The second section 144 of the sealant 140 is in contact with the driving substrate 110, the top electrode 130, and the display medium layer 120 which form the channel 150. As indicated by the arrow R, the second section 144 flows towards the first region 152 by capillarity action. In other words, the first section 142 of the sealant 140 overlapping the bonding region 230 is merely located in the first region 152 of the channel 150. As such, the sealant 140 below the bonding region 230 is prevented from protruding and squeezing the bonding region 230. Therefore, failure of the circuit of the bonding region 230 can be avoided. In addition, the sealant 140 has waterproof ability, and therefore vapor permeation can be avoided by filling the channel 150 with the sealant 140.

It is to be noted that the connection relationships described above will not be repeated. In the following description, a manufacturing method of the display device 10 will be described.

Figure 4A:
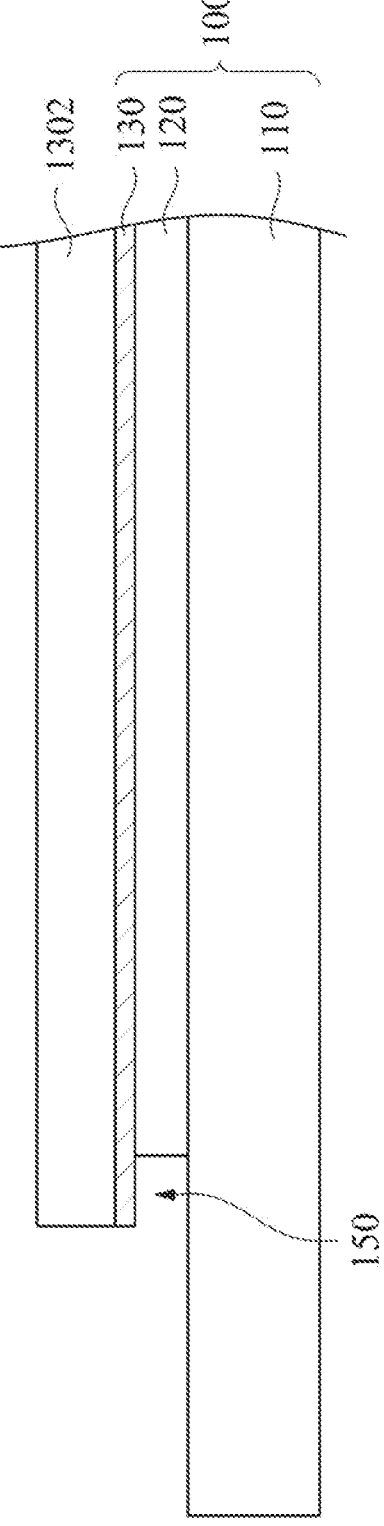
FIG. 4A is a cross-sectional view of an intermediate stage of the manufacturing method of the display device in FIG. 1.
Figure 4C:
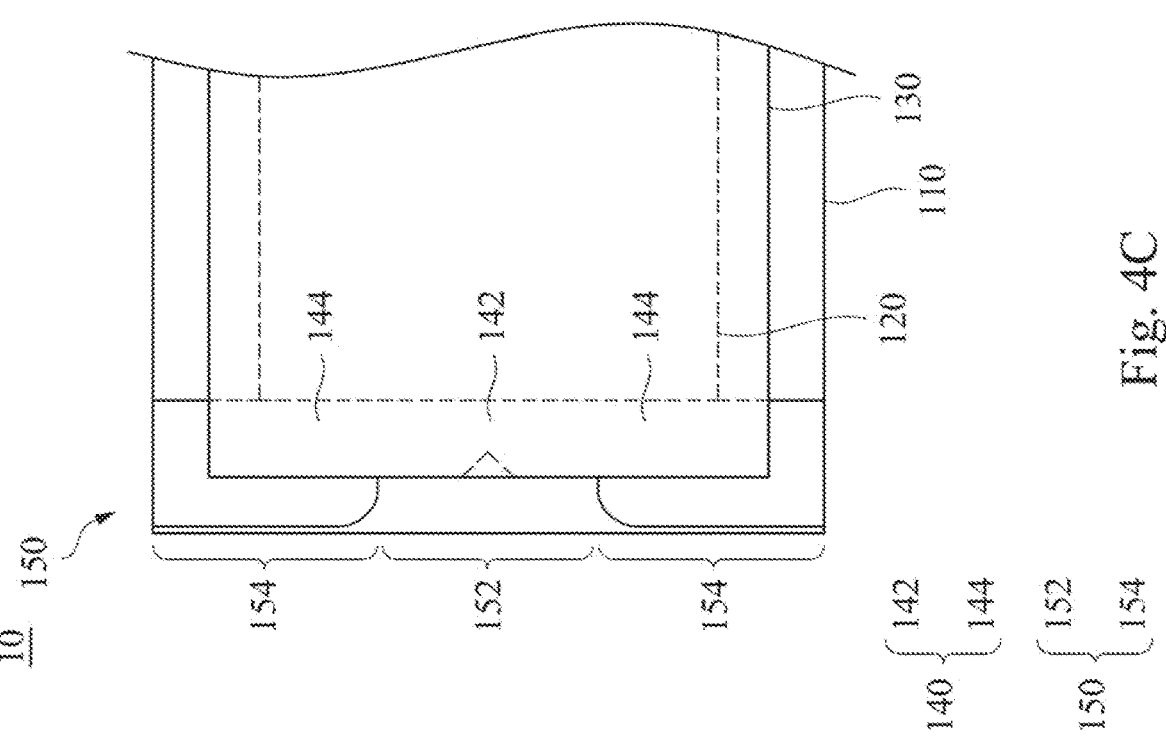
FIG. 4B to FIG. 4C are top views of intermediate stages of the manufacturing method of the display device in FIG. 4A.
Figure 4B:
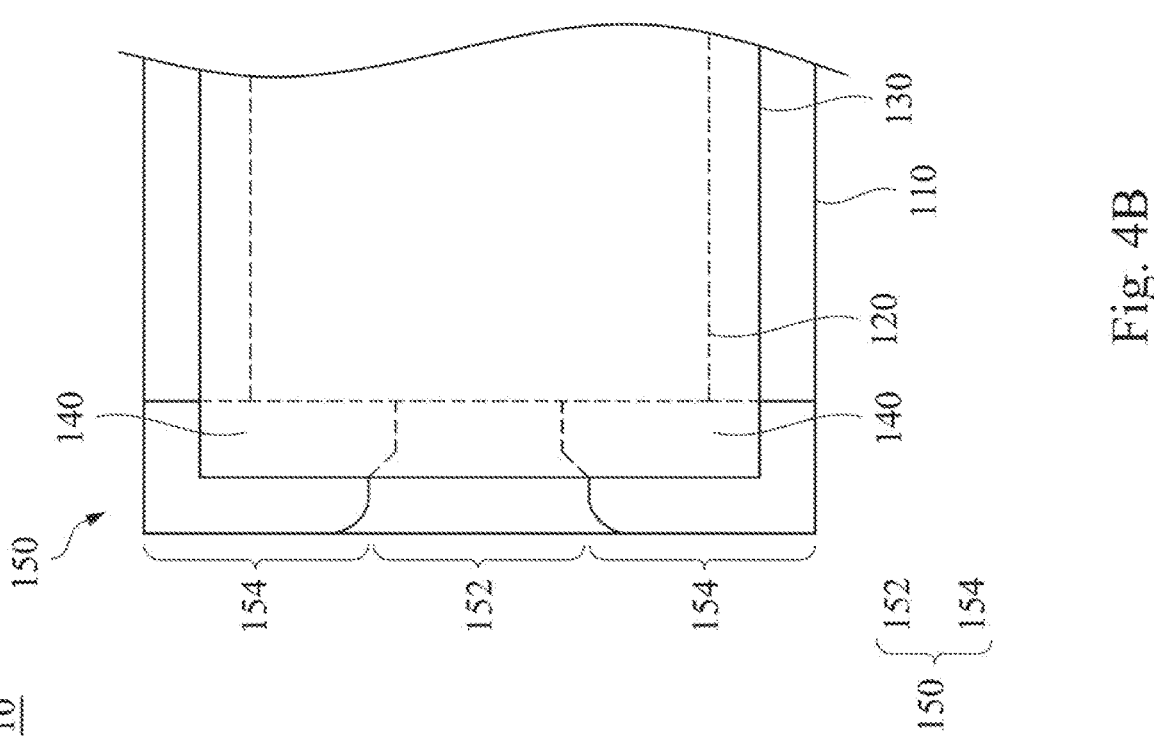

FIG. 4A is a cross-sectional view of an intermediate stage of the manufacturing method of the display device 10 in FIG. 1. FIG. 4B to FIG. 4C are top views of intermediate stages of the manufacturing method of the display device 10 in FIG. 4A. Reference is made to FIG. 4A, the manufacturing method of the display device 10 begins by disposing the top electrode 130 on the display medium layer 120, and the display medium layer 120 is located on the driving substrate 110. The top electrode 130, the driving substrate 110, and the display medium layer 120 collectively form a channel 150. The top electrode 130 includes a protection film 1302, and the protection film 1302 is located at a side of the top electrode 130 facing away from the display medium layer 120. Therefore, supporting force from the protection film 1302 can maintain the thickness and the shape of the channel 150 between the top electrode 130 and the driving substrate 110.

Reference is made to FIG. 4A and FIG. 4B simultaneously. The channel 150 includes a first region 152 and two second regions 154. The first region 152 is the region that will overlap the bonding region 230 (see FIG. 1) in the subsequent process. The second regions 154 are the regions that are away from the bonding region 230. In this step, distribution of the first region 152 and the second regions 154 can be determined based on the expected position of the bonding region 230.

Reference is made to FIG. 4B. In the manufacturing method of the display device 10, the sealant 140 is coated in the second region 154 of the channel 150 subsequently. As shown in FIG. 4B, the sealant 140 coated in the second region 154 not only fills the second region 154 of the channel 150 but also fills the portion outside the channel 150. In this step, the first region 152 of the channel 150 has no sealant 140. In the present embodiment, the sealant 140 is formed in the second region 154 by spray coating and is ribbon-shaped.

In the step of spray coating the sealant 140, the viscosity of the sealant 140 is smaller than 1200 centipoise. The temperature of the sealant 140 is heated to greater than 50 degree Celsius. The pressure of spray is greater than 15 kpa. Under those conditions, it is beneficial for the sealant 140 to flow towards the first region 152 by capillarity action. Flowing of the sealant 140 can be examined through an infrared spectroscope (e.g., Fourier-transform infrared spectroscopy, FTIR).

Reference is made to FIG. 4C. The sealant 140 flows towards the first region 152 from the second regions 154 by capillarity action. In the present embodiment, the sealant 140 flows inward from two sides of the first region 152. The first section 142 is formed by the portion of the sealant 140 flowing towards the first region 152 after the first region 152 of the channel 150 is filled. The first section 142 and the second section 144 collectively seal the display medium layer 120. As described above, the first section 142 is merely located in the first region 152 of the channel 150. As such, the sealant 140 below the bonding region 230 is prevented from protruding and squeezing the bonding region 230. Therefore, failure of the circuit of the bonding region 230 can be avoided.

Reference is made to FIG. 2. In the manufacturing method of the display device 10, the protection film 1302 is removed after the sealant 140 is formed. The touch module 200 is disposed on the display panel 100 subsequently. The bonding region 230 is located in the non-display region NA of the display panel 100. The orthogonal projection of the bonding region 230 on the driving substrate 110 overlaps the orthogonal projection of the first region 152 on the driving substrate 110. After this step, the light guide module 300 and the cover plate 400 are sequentially disposed on the touch module 200, and therefore the display device 10 is finished.

Figures 5A, 5B:
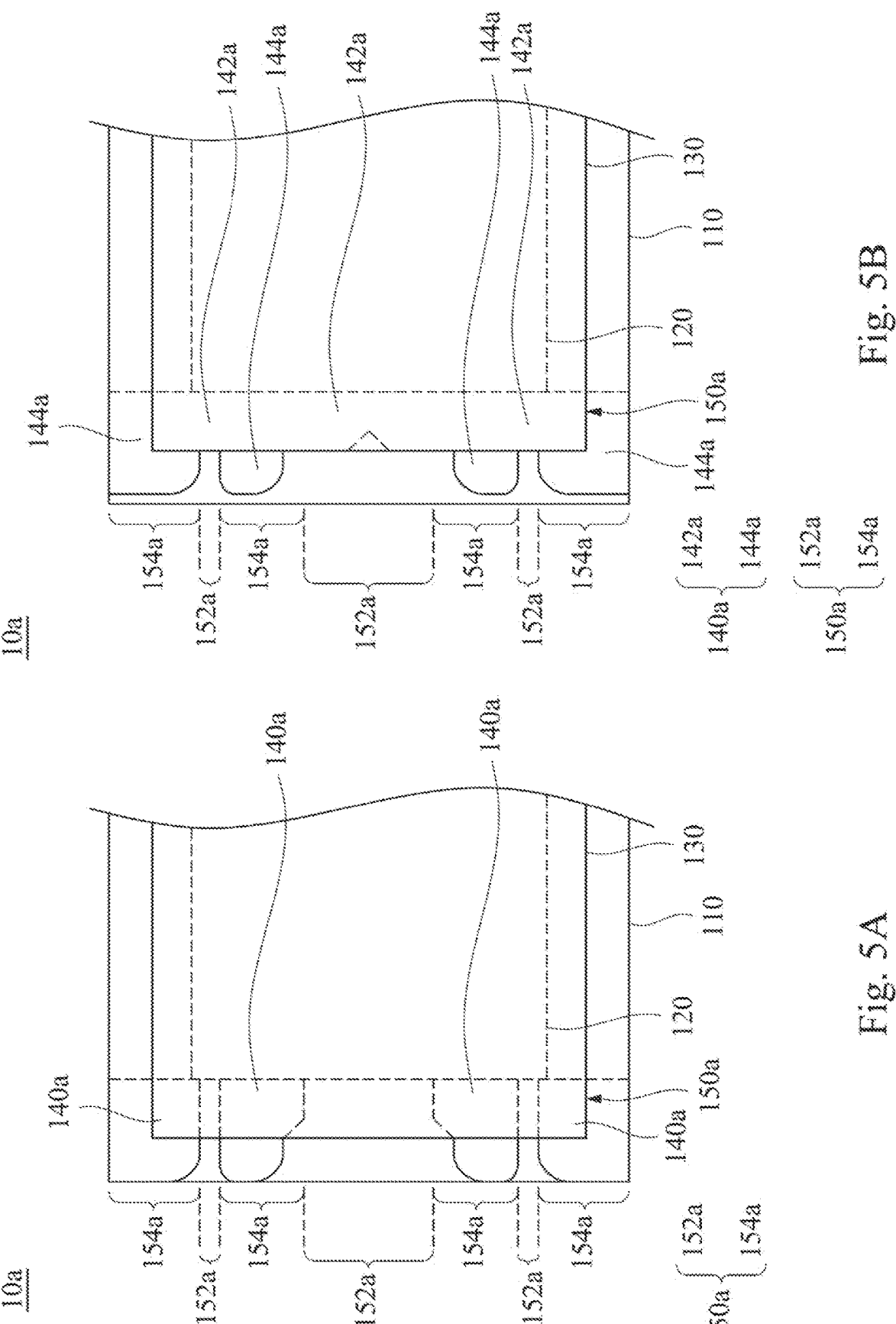
FIG. 5A to FIG. 5B are top views of intermediate stages of the manufacturing method of another display device accordingly to another embodiment of the present disclosure.

FIG. 5A to FIG. 5B are top views of intermediate stages of the manufacturing method of another display device 10a accordingly to another embodiment of the present disclosure. The manufacturing method of the display device 10a is similar to the manufacturing method of the display device 10 shown in FIG. 4A to FIG. 4B, and the difference is the distribution of the first region 152a and the second region 154a of the display device 10a. As shown in FIG. 5A, in the present embodiment, the channel 150a includes multiple second regions 154a. In other words, the sealant 140a has dot shape and is formed in the second region 154a by spray coating. The sealant 140a in the two second regions 154a at the center of the figure can flow towards the first regions 152a at two sides and the center of the figure so as to form the first sections 142a. In some embodiments, the bonding region 230 of the display device 10a is located at any one of the three first regions 152a. In other words, distribution is available as long as the portion of the sealant 140a that overlaps the bonding region 230 is formed by capillarity action. The display device 10a and the display device 10 shown in FIG. 1 have the same advantages, and therefore the description is not repeated hereinafter.

Figure 6B:
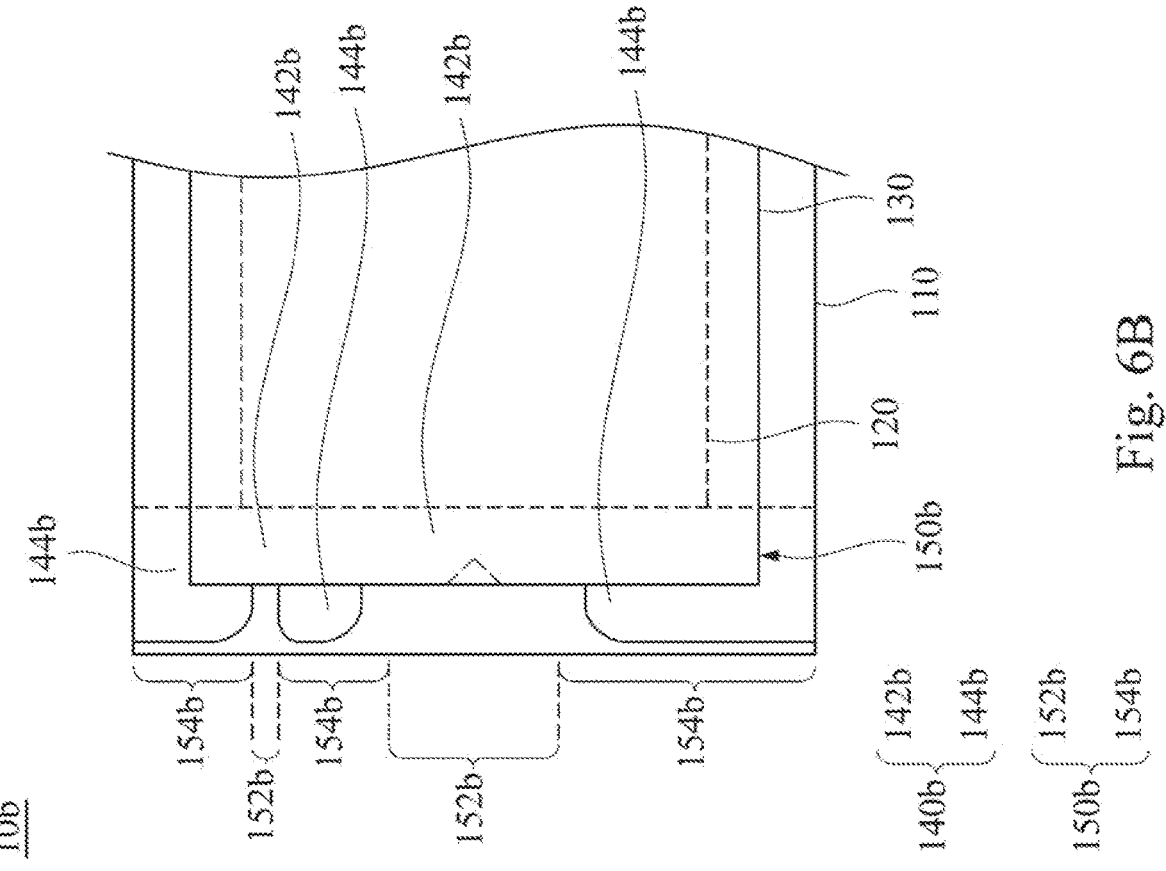
FIG. 6A to FIG. 6B are top views of intermediate stages of the manufacturing method of a display device accordingly to another embodiment of the present disclosure.
Figure 6A:
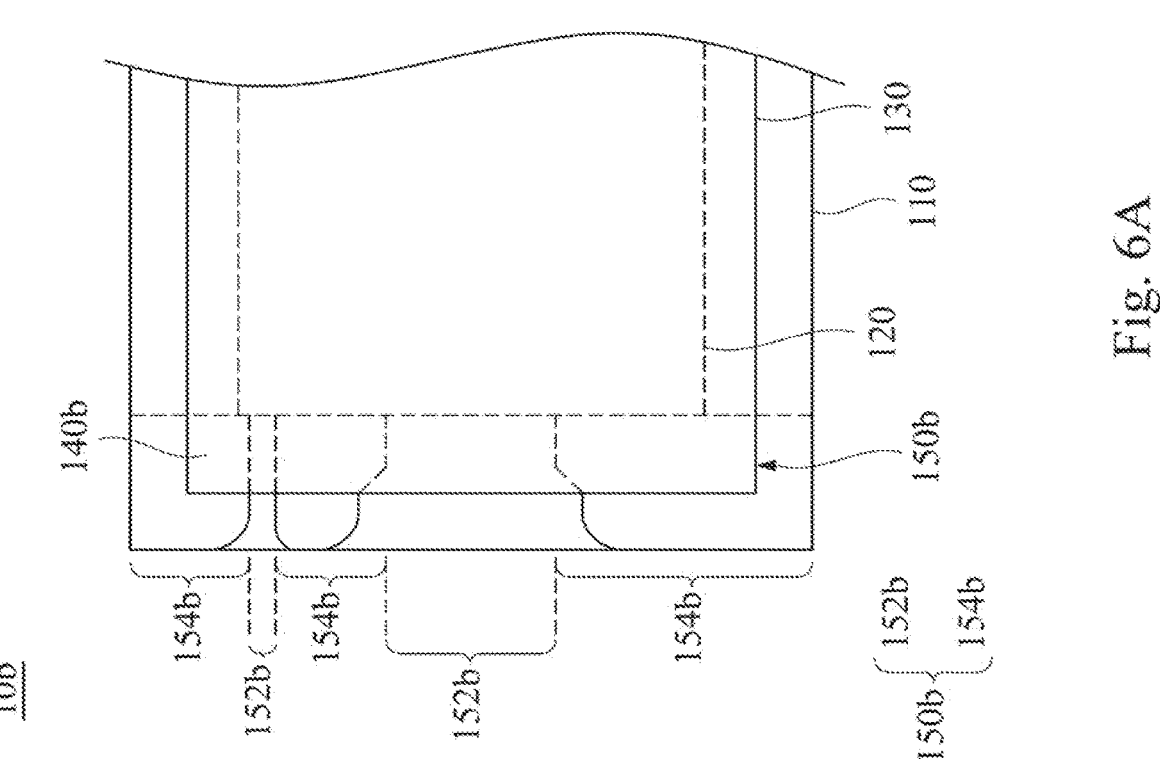

FIG. 6A to FIG. 6B are top views of intermediate stages of the manufacturing method of a display device 10b accordingly to another embodiment of the present disclosure. The manufacturing method of the display device 10b is similar to the manufacturing method of the display device 10a shown in FIG. 5A to FIG. 5B, and the difference is the distribution of the first region 152b and the second region 154b of the display device 10b. As shown in FIG. 6A, in the present embodiment, the channel 150b includes multiple second regions 154b. The sealant 140b includes second sections 144b having both ribbon shape and dot shape and formed by spray coating. In other words, the length or the volume of the sealant 140b in the second region 154b are not limited as long as the sealant 140b that flows towards the first region 152b can fill the channel 150b and form the first section 142b, and the first section 142b and the second section 144b collectively seal the display medium layer 120. The display device 10b and the display device 10 shown in FIG. 1 have the same advantages, and therefore the description is not repeated hereinafter.

Figure 7:
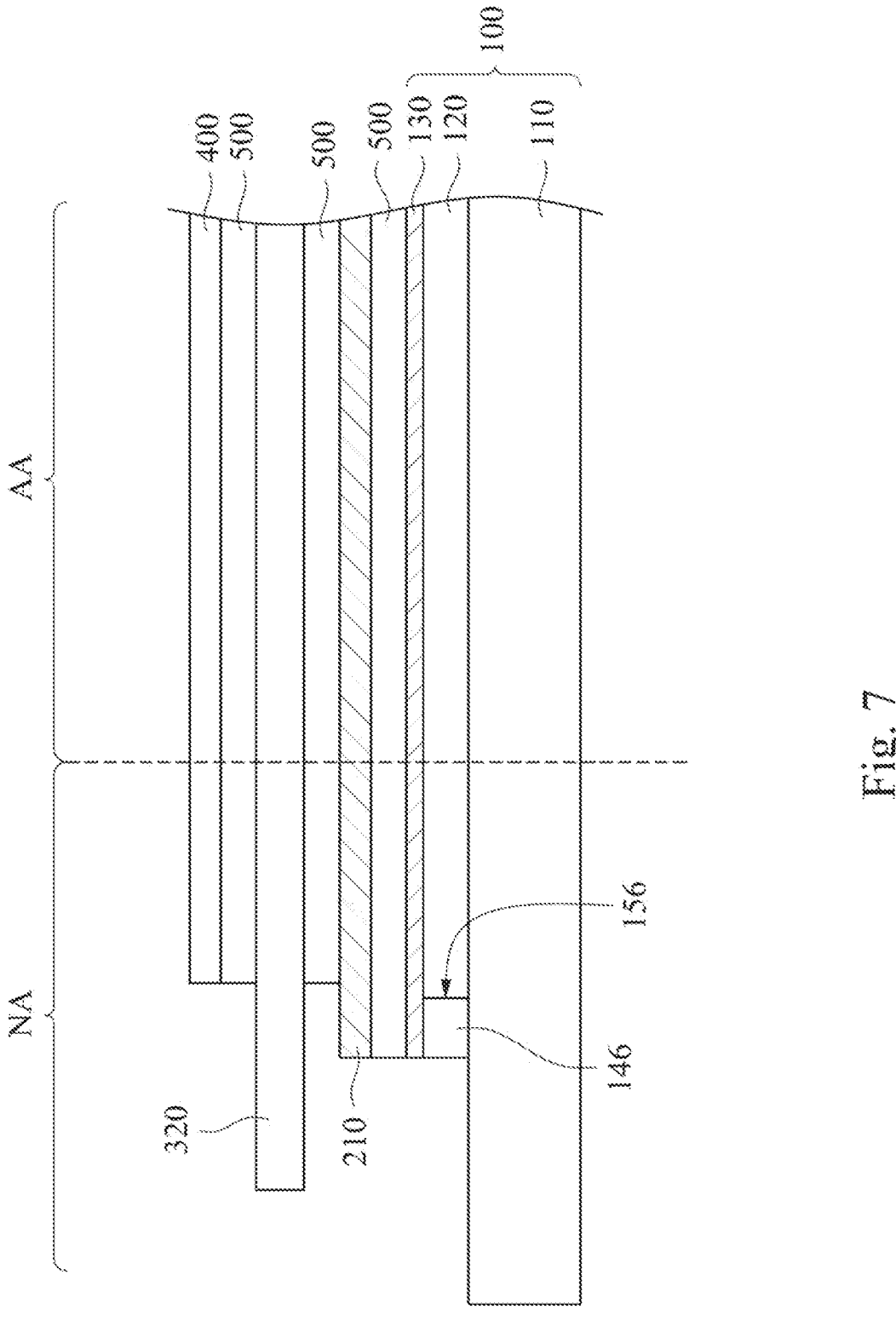
FIG. 7 is a cross-sectional view taken along the line 7-7 in FIG. 1.

FIG. 7 is a cross-sectional view taken along the line 7-7 in FIG. 1. Reference is made to FIG. 1 and FIG. 7 simultaneously. The display device 10 further includes a bending region F. The sealant 140 further includes a third section 146 located in the bending region F and a fourth section 148 away from the bending region F. The channel 150 includes a third region 156 located in the bending region F and a fourth section 158 away from the bending region F. The third section 146 is located in the third region 156 and is located between the top electrode 130 and the driving substrate 110. The fourth section 148 is located in the fourth region 158, and a thickness of the fourth section 148 is greater than a thickness of the third section 146. In other words, the structures of the third section 146 and the first section 142 are the same, and the structures of the fourth section 148 and the second section 144 are the same. An orthogonal of the third section 146 one the driving substrate 110 is located within the orthogonal of the top electrode 130 one the driving substrate 110. An orthogonal of the fourth section 148 one the driving substrate 110 is located partially outside the orthogonal projection of the top electrode 130 on the driving substrate 110.

As described in the manufacturing method shown in FIG. 4B and FIG. 4C, the sealant 140 coated in the fourth region 158 flows towards the third region 156 from the fourth region 158 by capillarity action so as to form the third section 146. With such design, bubble formation in the sealant 140 in the bending region F can be avoided. As such, the number of bending of the display device 10 is increased so as to improve the lifespan of the display device 10.

Figure 8:
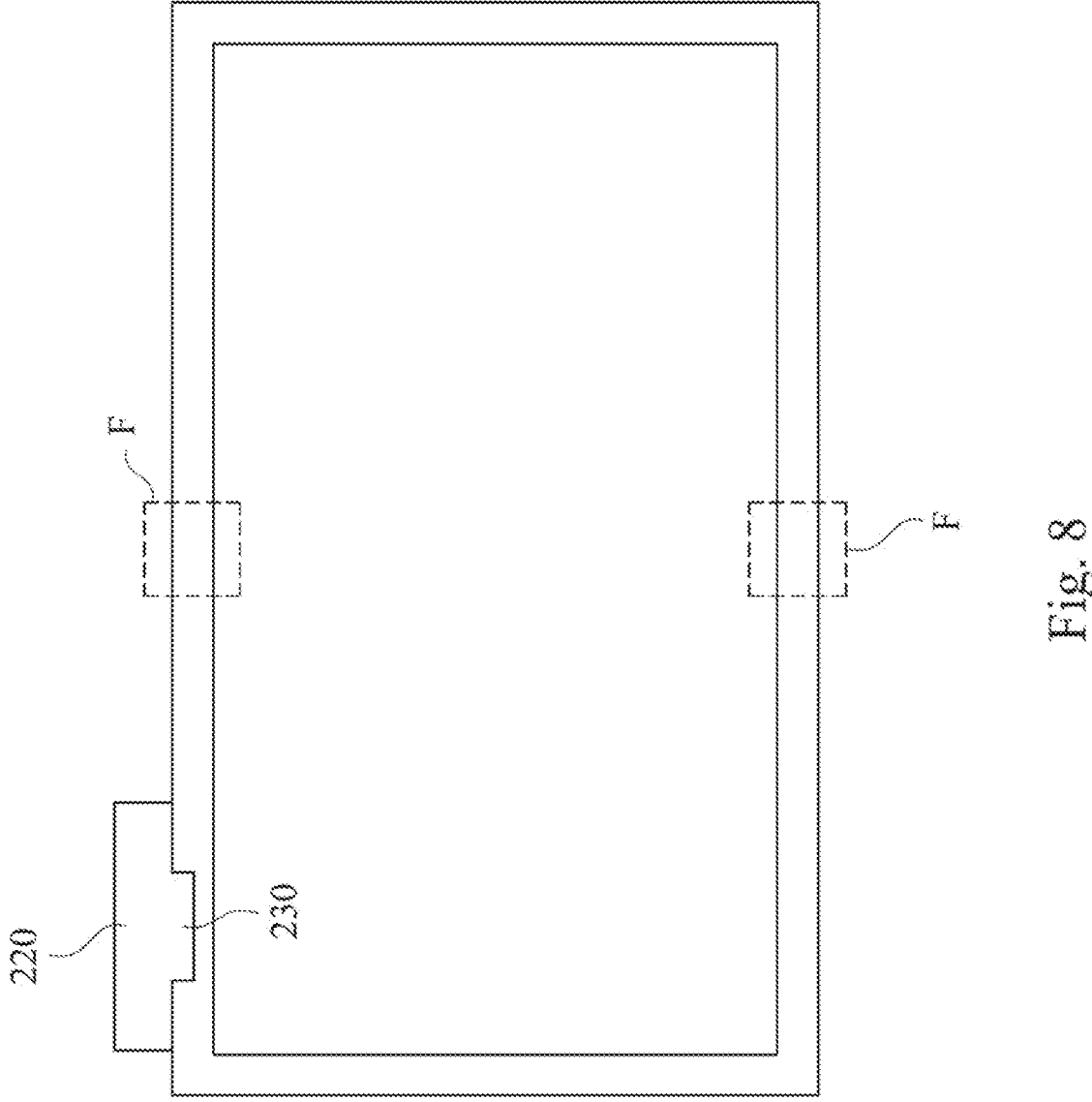
FIG. 8 is a top view of a display device according to one embodiment of the present disclosure.

FIG. 8 is a top view of a display device 10c according to one embodiment of the present disclosure. The display device 10c is substantially the same as the display device 10, and the difference is that the bending region 230 of the display device 10c and the bending region F are located at the same side of the display device 10c. In other words, the relative positions of the bonding region 230 and the bending region F can be adjusted arbitrarily. The display device 10c and the display device 10 have the same advantages, and therefore the description is not repeated hereinafter.

In summary, the second section of the sealant is away from the bonding region, the second section is in contact with the driving substrate, the top electrode, and the display medium layer that form the channel, and the second section flows towards the region overlapping the bonding region by capillarity action. In other words, the first section of the sealant overlapping the bonding region is merely located in the first region. As such, the sealant below the bonding region is prevented from protruding and squeezing the bonding region. Therefore, failure of the circuit of the bonding region can be avoided. In addition, the sealant has waterproof ability, and therefore vapor permeation can be avoided by filling the channel with the sealant. In some embodiment, portions of the sealant located outside the bending region can flow towards the third region overlapping the bending region. With such design, bubble formation in the sealant in the bending region can be avoided. As such, the number of bending of the display device is increased so as to improve the lifespan of the display device.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A display device having a display region and a non-display region, wherein the display device comprises:
a display panel, comprising;
a driving substrate;
a display medium layer located on the driving substrate;
a top electrode located on the display medium layer; and
a sealant surrounding the display medium layer and the top electrode, wherein the sealant comprises a first section and at least one second section connected with the first section, the first section of the sealant is located between the top electrode and the driving substrate, and a thickness of the second section is greater than a thickness of the first section; and
a touch module disposed on the display panel, wherein the touch module comprises a bonding region located in the non-display region, and an orthogonal projection of the bonding region onto a top surface of the driving substrate overlaps an orthogonal projection of the first section of the sealant onto the top surface of the driving substrate.

2. The display device of claim 1, wherein the orthogonal projection of the bonding region onto the top surface of the driving substrate is away from an orthogonal projection of the second section of the sealant onto the top surface of the driving substrate.

3. The display device of claim 1, wherein the thickness of the first section equals a distance between a bottom surface of the top electrode facing the driving substrate and the top surface of the driving substrate facing the top electrode.

4. The display device of claim 1, wherein the orthogonal projection of the first section of the sealant onto the top surface of the driving substrate is located within an orthogonal projection of the top electrode onto the top surface of the driving substrate.

5. The display device of claim 1, wherein the thickness of the second section is greater than a sum of a thickness of the display medium layer and a thickness of the top electrode.

6. The display device of claim 1, wherein the orthogonal projection of the second section of the sealant onto the top surface of the driving substrate is located partially outside the orthogonal projection of the top electrode onto the top surface of the driving substrate.

7. The display device of claim 1, wherein a number of the second section is plural, and the second sections are located at two sides of the first section.

8. The display device of claim 1, further comprising a bending region, wherein the sealant further comprises a third section located in the bending region, and the third section is located between the top electrode and the driving substrate.

9. The display device of claim 8, wherein an orthogonal projection of the third section of the sealant onto the top surface of the driving substrate is located within the orthogonal projection of the top electrode onto the top surface of the driving substrate.

10. The display device of claim 8, wherein the sealant further comprises a fourth section away from the bending region, and a thickness of the fourth section is greater than a thickness of the third section.

11. The display device of claim 10, wherein an orthogonal projection of the fourth section of the sealant onto the top surface of the driving substrate is located partially outside the orthogonal projection of the top electrode onto the top surface of the driving substrate.

* * * * *